United States Patent [19]
Eytcheson et al.

[11] Patent Number: 5,895,974
[45] Date of Patent: Apr. 20, 1999

[54] DURABLE SUBSTRATE SUBASSEMBLY FOR TRANSISTOR SWITCH MODULE

[75] Inventors: Charles Tyler Eytcheson, Kokomo; Todd G. Nakanishi, Noblesville; Frank David Lachenmaier, Kokomo; Michael D. Bramel, Summitville, all of Ind.

[73] Assignee: Delco Electronics Corp., Kokomo, Ind.

[21] Appl. No.: 09/056,046

[22] Filed: Apr. 6, 1998

[51] Int. Cl.⁶ .................................................. H01L 23/34
[52] U.S. Cl. ............................ 257/723; 257/724; 257/706; 257/107
[58] Field of Search ................................. 257/107, 723, 257/724, 703, 707, 706, 705

[56] References Cited

U.S. PATENT DOCUMENTS

| | | | |
|---|---|---|---|
| 3,714,709 | 2/1973 | Liederbach | 29/626 |
| 4,034,471 | 7/1977 | Bias | 29/629 |
| 4,352,120 | 9/1982 | Kurihara et al. . | |
| 4,538,170 | 8/1985 | Yerman . | |
| 4,694,322 | 9/1987 | Sakurai et al. | 357/74 |
| 4,766,481 | 8/1988 | Gobrecht et al. | 357/80 |
| 5,261,040 | 11/1993 | Iwasa et al. . | |
| 5,297,001 | 3/1994 | Sterling | 361/717 |
| 5,311,043 | 5/1994 | Stockmeier | 257/177 |
| 5,347,160 | 9/1994 | Sutrina | 257/698 |
| 5,408,128 | 4/1995 | Furnival | 257/690 |
| 5,444,295 | 8/1995 | Lake et al. | 257/678 |
| 5,492,842 | 2/1996 | Eytcheson et al. | 437/7 |
| 5,512,790 | 4/1996 | Lachenmaier et al. | 307/112 |
| 5,517,059 | 5/1996 | Eytcheson et al. | 257/699 |
| 5,519,253 | 5/1996 | Lake et al. | 257/724 |
| 5,523,620 | 6/1996 | Eytcheson et al. | 257/690 |
| 5,539,254 | 7/1996 | Eytcheson et al. | 257/691 |
| 5,559,374 | 9/1996 | Ohta et al. . | |
| 5,563,447 | 10/1996 | Lake et al. | 257/724 |
| 5,616,955 | 4/1997 | Yamada et al. . | |
| 5,821,617 | 10/1998 | Autry et al. . | |

FOREIGN PATENT DOCUMENTS

| | | | |
|---|---|---|---|
| 0189522 A2 | 6/1986 | European Pat. Off. | H01R 9/28 |
| 0277546 A1 | 1/1988 | European Pat. Off. | H01L 25/04 |
| 0427143 A3 | 11/1990 | European Pat. Off. | H01L 25/07 |
| 2452178 | 3/1980 | France | H01L 23/10 |
| 3 312 081 A1 | 10/1984 | Germany | H05K 5/00 |
| 3 935 711 A2 | 5/1990 | Germany | H05K 5/02 |

*Primary Examiner*—Edward Wojciechowicz
*Assistant Examiner*—S. V. Clark
*Attorney, Agent, or Firm*—Jimmy L. Funke

[57] ABSTRACT

A durable substrate subassembly for a high power transistor switching module. The substrate subassembly is durable because wire bonds to the semiconductor device electrodes are replaced with a soldered metal/ceramic composite conductor. The part of the composite conductor contacting the semiconductor device has a coefficient of thermal expansion close to that of the semiconductor device. The metal of the composite conductor is preferably a strip of copper foil. The ceramic portion is a layer of alumina on the copper foil that is generally coextensive with the semiconductor device electrodes.

18 Claims, 7 Drawing Sheets

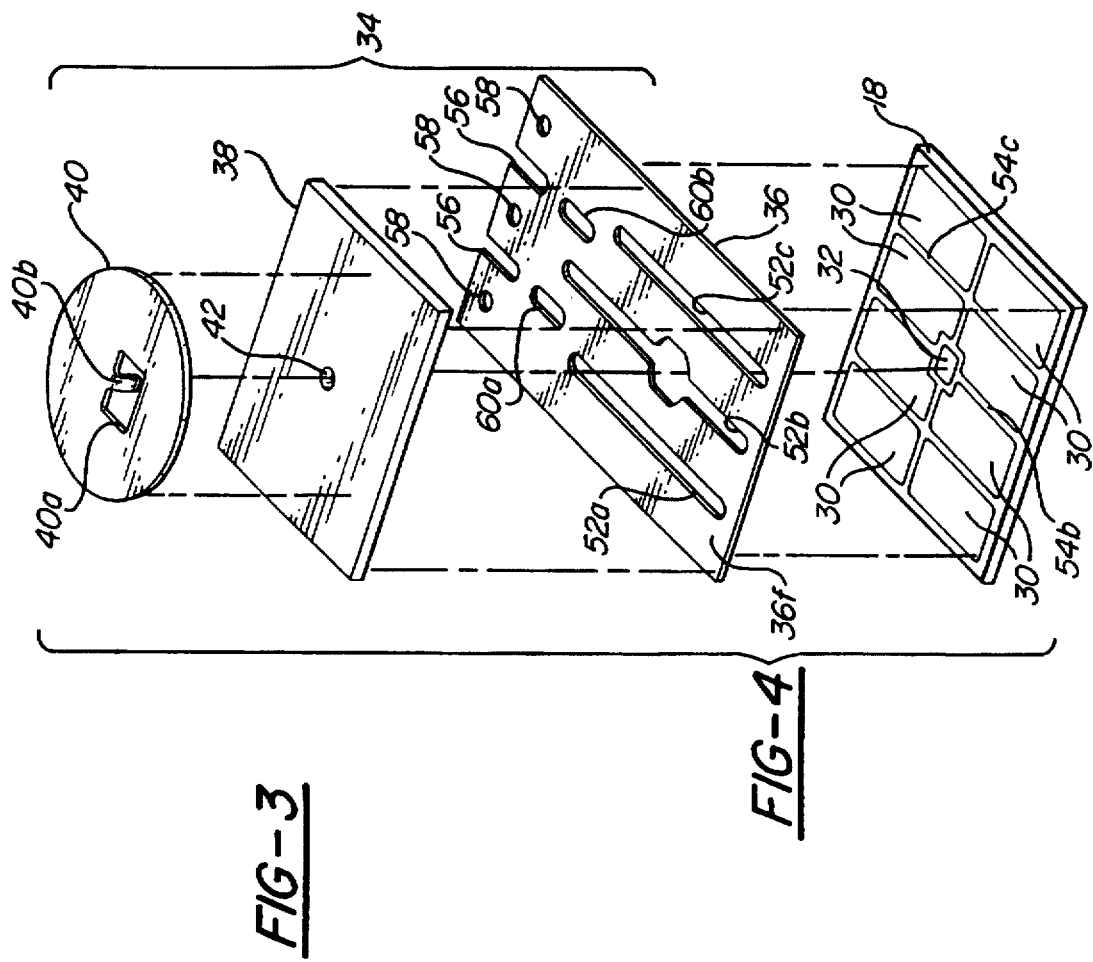
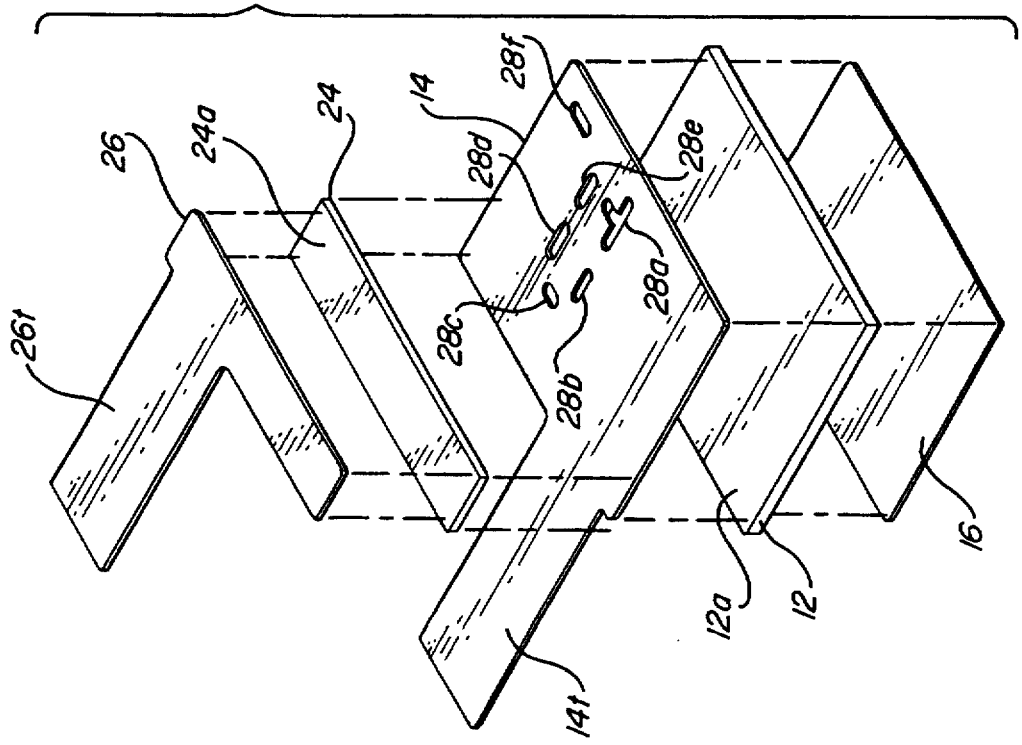

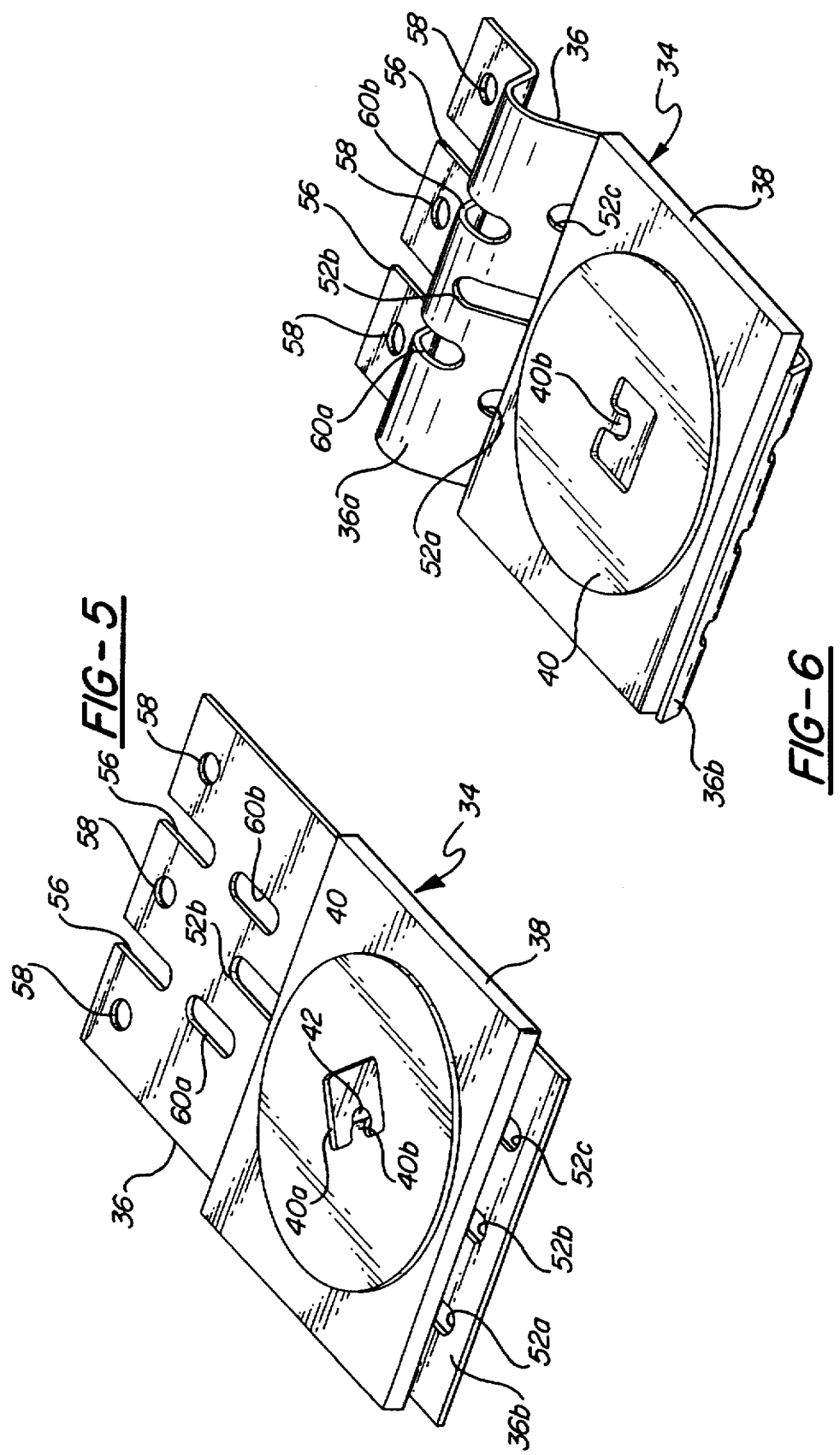

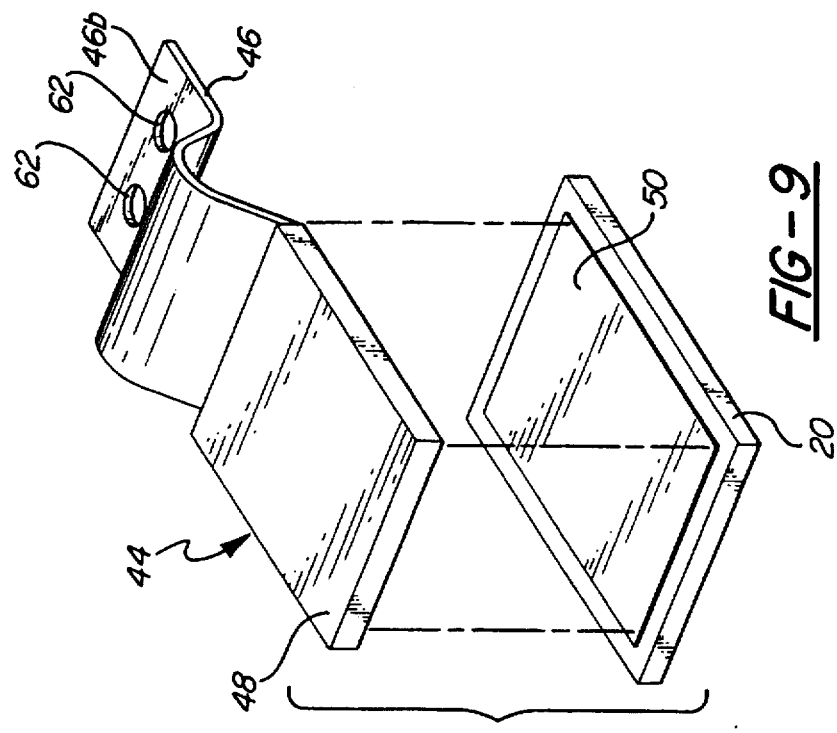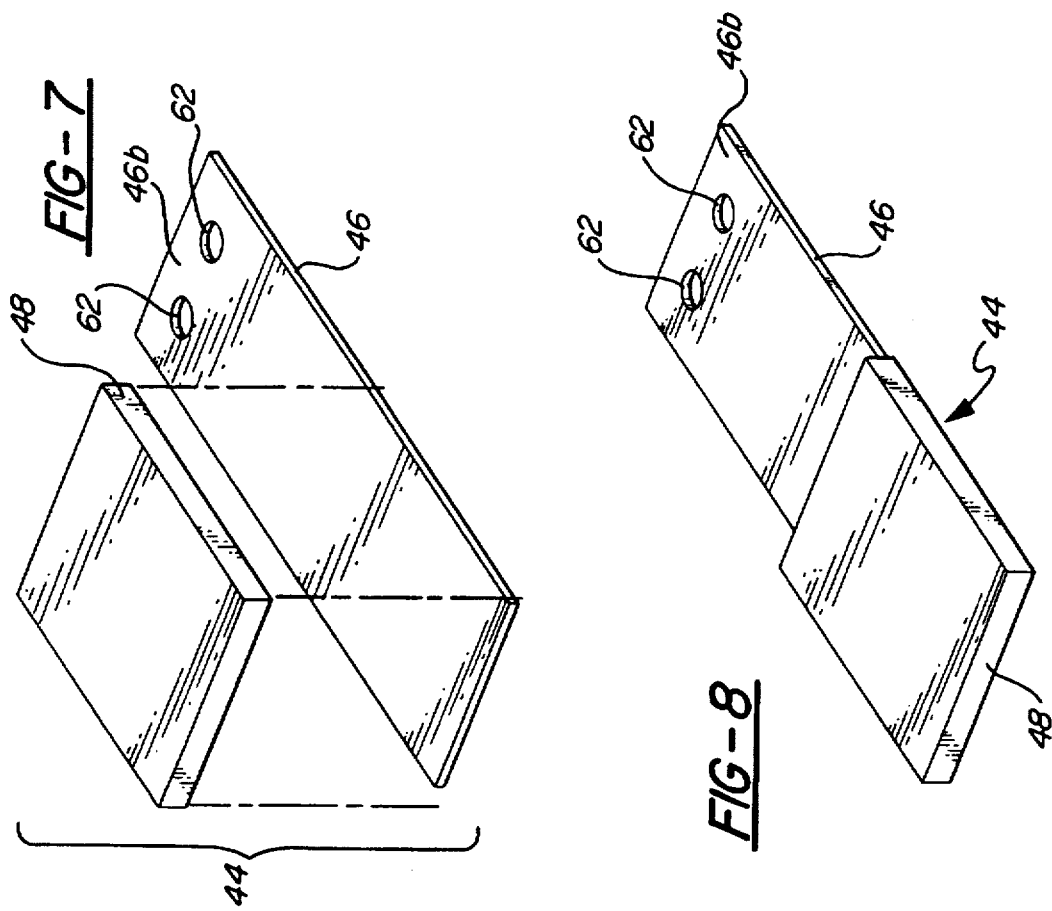

DURABLE SUBSTRATE SUBASSEMBLY FOR TRANSISTOR SWITCH MODULE

RELATED PATENTS

This patent application is related to a United States Patent Application filed on or about the same date as this patent application in the name of C. T. Eytcheson, entitled "Durable Substrate Subassembly With Alignment and Stress relief Features" and identified by Applicant's No. H-202230 and also by No. 5699-000075.

This patent application describes and claims a modification to the inventions described and claimed in U.S. Pat. Nos. 5,539,254 Eytcheson et al., issued Jul. 23, 1996, 5,523,620 Eytcheson et al., and 5,492,842 Eytcheson et al. issued Feb. 20, 1996. The foregoing United States patents are hereby incorporated herein by reference.

This invention is also related to the following United States patents, which are also incorporated herein by reference: U.S. Pat. No. 5,563,447 Lake et al., issued Oct. 8, 1996; U.S. Pat. No. 5,519,253 Lake et al., issued May 21, 1996; U.S. Pat. No. 5,444,295 Lake et al., issued Aug. 22, 1995; U.S. Pat. No. 5,517,059 Eytcheson et al., issued May 14, 1996; and U.S. Pat. No. 5,512,790 Lachenmaier et al.

FIELD OF THE INVENTION

This invention relates to packaging of a high voltage/high current/high frequency semiconductor switching device. More specifically, this invention relates to a distinctive subassembly containing such a switching device, and to a power module containing a plurality of such distinctive subassemblies. This invention further includes methods of making such products.

BACKGROUND OF THE INVENTION

Insulated gate bipolar transistors (IGBTs) are an extremely attractive semiconductor device for power applications. They are more attractive than a power-type insulated gate field effect transistor (IGFET), which is popularly referred to as a MOSFET. An IGBT can handle both high voltages and high currents with small die size and with relatively low "on" resistance. In addition, an IGBT can be switched rapidly, making IGBTs potentially useful as switches in a three phase inverter for a high power alternating current motor application.

On the other hand, the high current density capability and low "on" resistance of the IGBT also present challenges. The possibility of device failure is aggravated when the IGBT is handling high power. The expression high power means current densities above about 135 amps per square centimeter of active chip area, at hundreds of volts. The expression high frequency switching means on/off frequencies above about 18 kilohertz, as for example 30 kilohertz. As might be expected, significant impedance, material and mechanical problems are encountered in handling such power at high frequencies and low resistances. This is especially true for a high power/high frequency module, in which several such IGBTs are electrically paralleled. Prior to the the inventions of the related patents mentioned above, the foregoing problems were so difficult that not many high power/high frequency IGBT modules had been commercially manufactured. Of those that were made, they were made in low volume and each was individually specially crafted.

The related patents mentioned above describe a distinctive semiconductor substrate subassembly containing a high power/high frequency semiconductor switching device, and power modules containing the same. The subassemblies and modules are designed for manufacture on a commercial production basis. By commercial production basis, is meant production volumes such used in the automotive industry. The semiconductor subassemblies, and methods involving them, are particularly claimed in U.S. Pat. Nos. 5,492,842 and 5,539,254 both of whom were issued to Eytcheson et al. These and the other above-mentioned patents describe principles by which high quality and high performance subassemblies and modules can be more effectively manufactured on a commercial production basis. The above-mentioned patents describe semiconductor substrate subassemblies in which the upper surface of each semiconductor device has a plurality of filamentary wires bonded to it. In such a construction, the upper surface of the switching device has a plurality of contact pads and a plurality of filamentary wires bonded to the pads. More specifically, each contact pad on the semiconductor device has an end of at least one filamentary wire precisely located on it and bonded to it. The opposite end of each filamentary wire is bonded to an adjacent contact area on a supporting substrate for the semiconductor device.

In the subject invention, the plurality of filamentary wires extending from each device is replaced by a single terminal strap that is soldered in place. The terminal strap is unique in that it is partially metal and partially of composite material, both parts are solderable, the composite material part of the strap is soldered to the semiconductor chip contact pads, and the composite material part of the strap has a coefficient of thermal expansion close to the coefficient of thermal expansion of silicon. This unique terminal strap provides an electrical connection to the semiconductor switching device that is more durable during operation than the filamentary wires. However, it provides other benefits as well. For example, it provides a more mechanically durable subassembly during handling prior to assembly into a high power/high frequency module. A shorter emitter lead is provided, and it has improved parallelism and uniformity with the collector lead of the switching device. It would thus appear that subassembly parasitic electrical effects are reduced.

Use of these improved substrate subassemblies and methods, permit more economic manufacture of higher durability insulated gate bipolar transistor (IGBT) modules at automotive volumes. It is also believed that substrate subassemblies of lower electrical impedance are also obtained.

OBJECTS AND SUMMARY OF THE INVENTION

It is a principle object of this invention to provide an improved semiconductor contact and method.

It is an object of this invention to provide an improved substrate subassembly that can handle high power electrical currents at high frequencies and method of making it.

It is also an object of this invention to provide semiconductor substrate subassemblies of high uniformity for high power/high frequency semiconductor modules and methods.

Another object of this invention is to provide modules containing such semiconductor substrate subassemblies.

Further objects of this invention are to provide methods of making such substrate subassemblies and modules.

These and other objects of the invention are achieved in a distinctive substrate subassembly construction that has only one active switching device. Substrate subassemblies can be reproduced with an improved degree of consistency,

3 and to the extent differences result, the substrate subassemblies can be readily handled, and effectively tested and sorted into very closely matched groups, before assembling them into a module.

In this invention, the semiconductor substrate subassembly of U.S. Pat. No. 5,492,842 and U.S. Pat. No. 5,539,254 is improved by substituting a unique connector strip, for the multiplicity of emitter connector wires previously used. The unique connector strip has a portion that is of a metal/ceramic composite material having a coefficient of thermal expansion close to the coefficient of thermal expansion of silicon. The strip is solderable even in its composite material portion, which is the portion of the strip soldered to the semiconductor device contact pads. In its preferred form, the connector strip is a metal foil, such as a copper foil. The lower surface of the strip is soldered to the semiconductor device contact pads, at a lower surface area near one end of the strip. A layer of ceramic is bonded to the upper surface of the strip at an upper surface area of the connector strip opposite from the lower surface area soldered to the semiconductor device contact pads. The ceramic layer is thicker than the metal foil and has a coefficient of thermal expansion close to that of silicon, as for example alumina or beryllia. Accordingly, the part of the connector strip soldered to the semiconductor device is formed of a metal ceramic composite material.

The other end of the copper foil connector strip need not have such a layer of ceramic. It preferably has no ceramic bonded to it, and is soldered to a metallized ceramic connector pad on the substrate subassembly. A short tab projects from the metallized connector pad for connection to a module terminal member. Other aspects of the semiconductor substrate subassembly are essentially as described and claimed in U.S. Pat. No. 5,492,842 and U.S. Pat. No. 5,539,254.

As with the semiconductor substrate subassembly of U.S. Pat. No. 5,492,842 and U.S. Pat. No. 5,539,254, the improved subassembly of this invention permits one to obtain a high degree of electrical symmetry among switching transistors grouped in a module, and in their electrical connections to module terminal members. These connections have low parasitic impedance loses because they are quite short. However, in addition, the emitter lead of this invention is a strap that has enhanced handling and electrical durability over filamentary wires. Still further, it is believed that the enhanced parallelism of the emitter foil connector to the collector connections, as compared to a plurality of filamentary wires, provides enhanced emitter/collector inductive cancellation in the substrate subassembly.

BRIEF DESCRIPTION OF THE DRAWINGS

FIG. 3 shows an exploded perspective view of the metallized ceramic wafer parts forming the supporting portion and contact terminals for the substrate subassembly shown in FIGS. 1-2.

FIG. 4 shows an exploded perspective view of the switching transistor chip and individual parts of its emitter/gate composite contact subassembly that are shown in FIGS. 1-2.

FIG. 5 shows the emitter/gate composite contact subassembly of FIG. 4 after bonding but before contouring and

4 soldering to contact pads on the upper surface of the switching transistor.

FIG. 6 shows the composite contact subassembly of FIG. 5 after contouring in preparation for soldering to the upper surface of the switching transistor chip.

Figure 1:
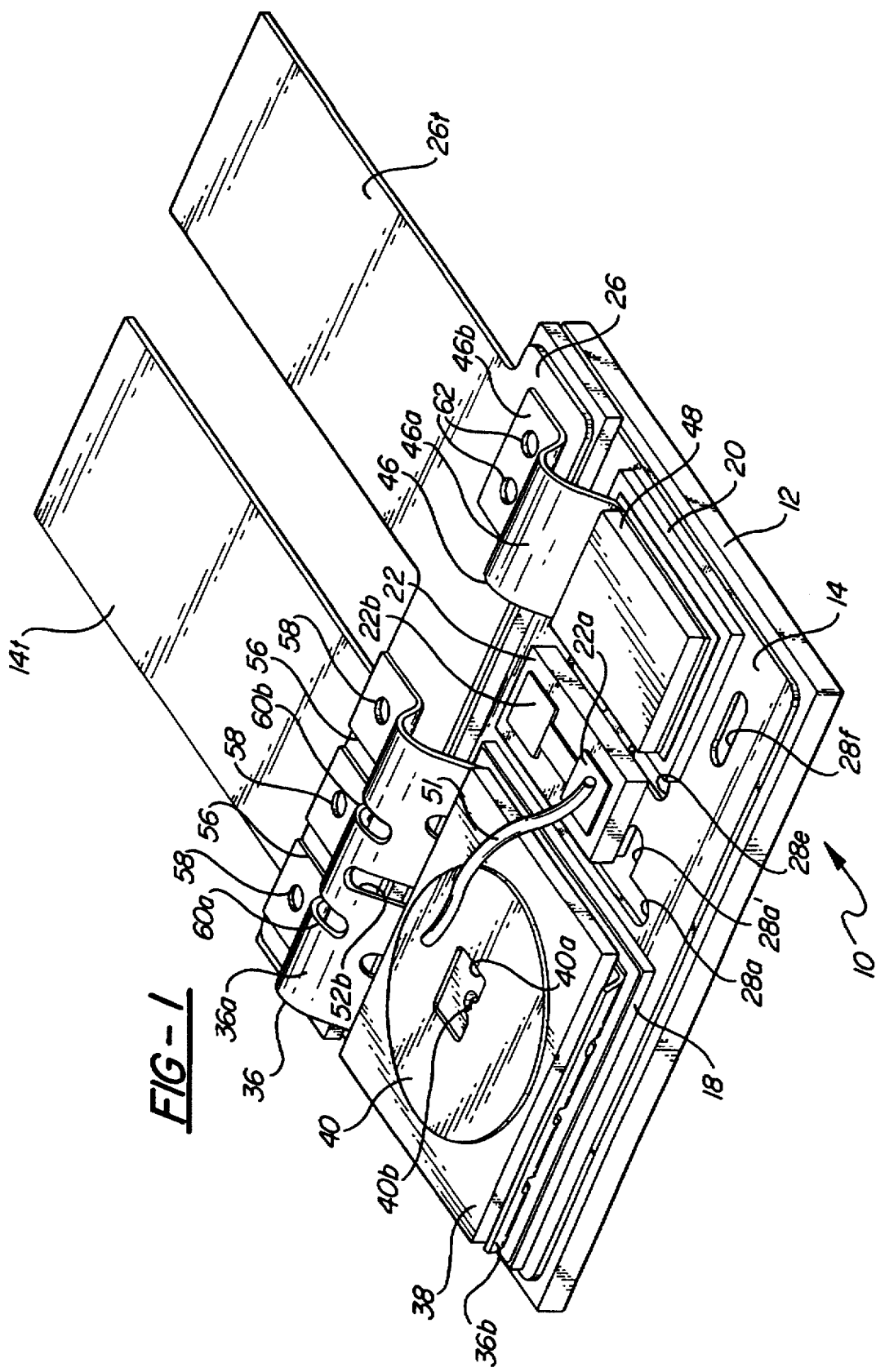
FIG. 1 shows a perspective view of the improved substrate subassembly made in accordance with this invention. The substrate subassembly includes a switching transistor chip and a soft fast diode chip.
Figure 2:
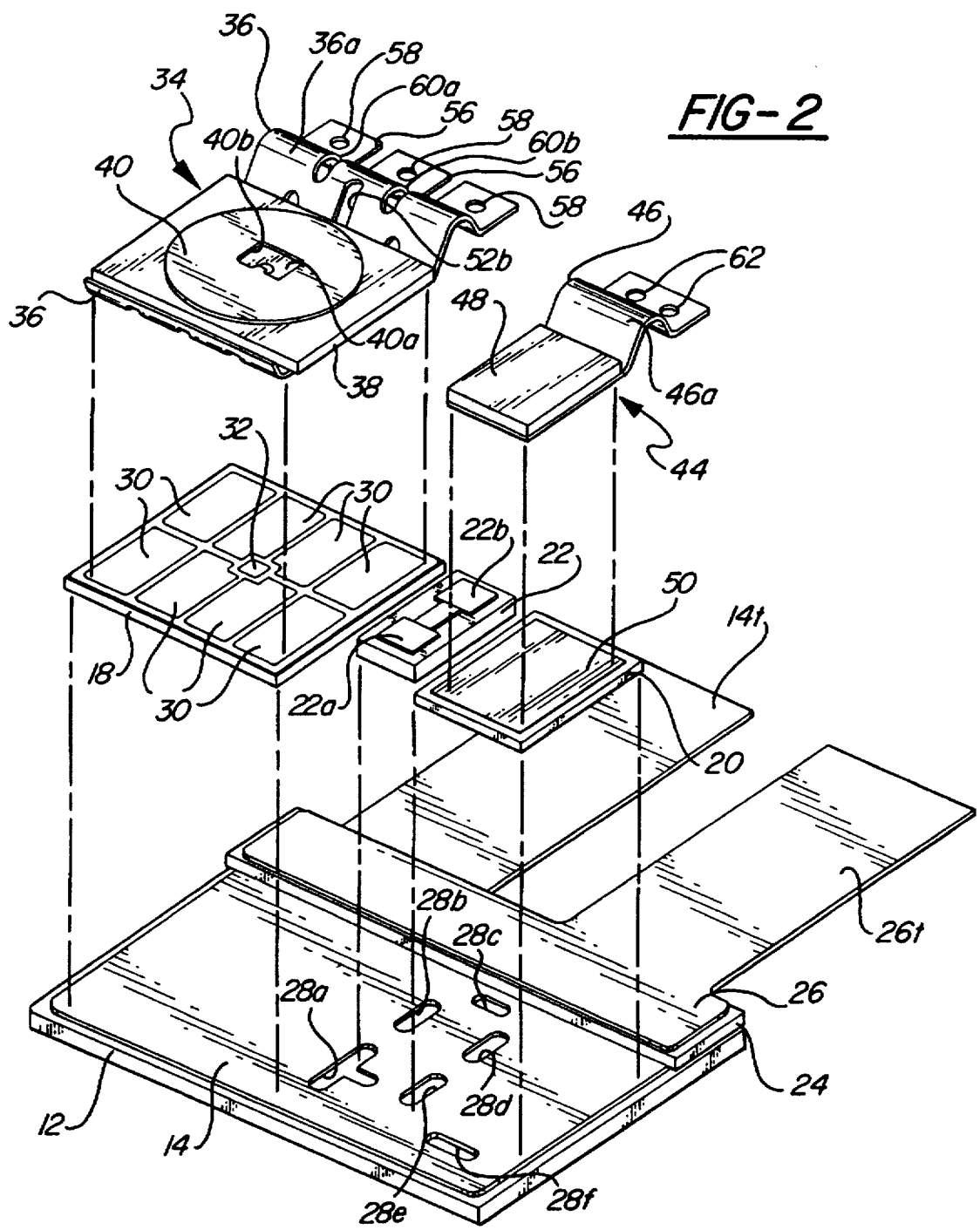
FIG. 2 shows an exploded perspective view of the substrate subassembly shown in FIG. 1.

FIG. 7 shows an exploded view of a composite contact subassembly for the diode chip shown in FIGS. 1-2.

FIG. 8 shows the composite contact subassembly of FIG. 7 after bonding but before contouring and soldering to the diode chip upper surface.

FIG. 9 shows the composite contact subassembly of FIG. 8 after contouring in preparation for soldering to the upper surface of the diode chip.

Figure 10:
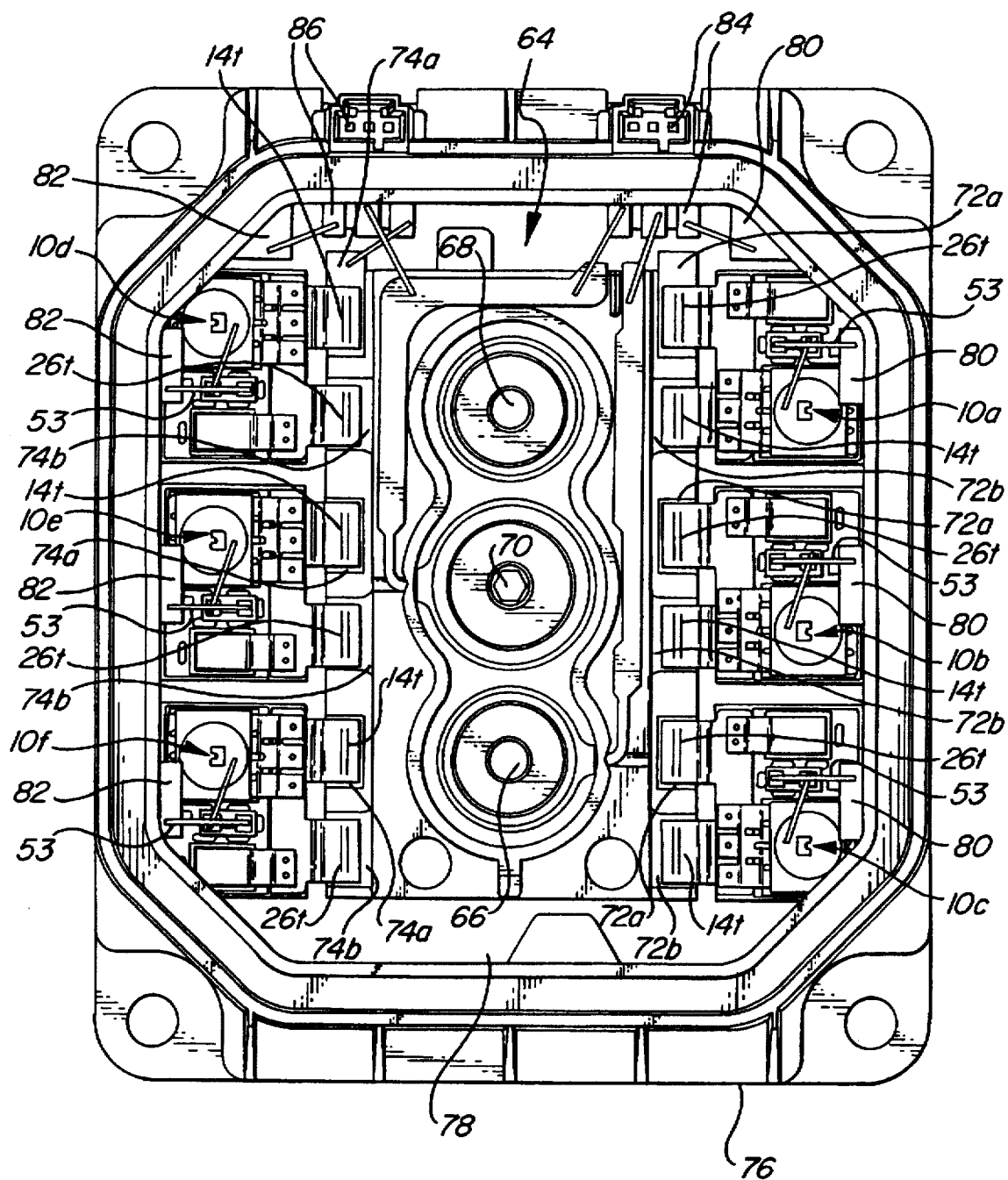

FIG. 10 shows a plan top view of a linear type dual switch module incorporating six substrate subassemblies such as the substrate subassembly shown in FIGS. 1-2, before a cover is bonded over the module housing.

Figure 11:
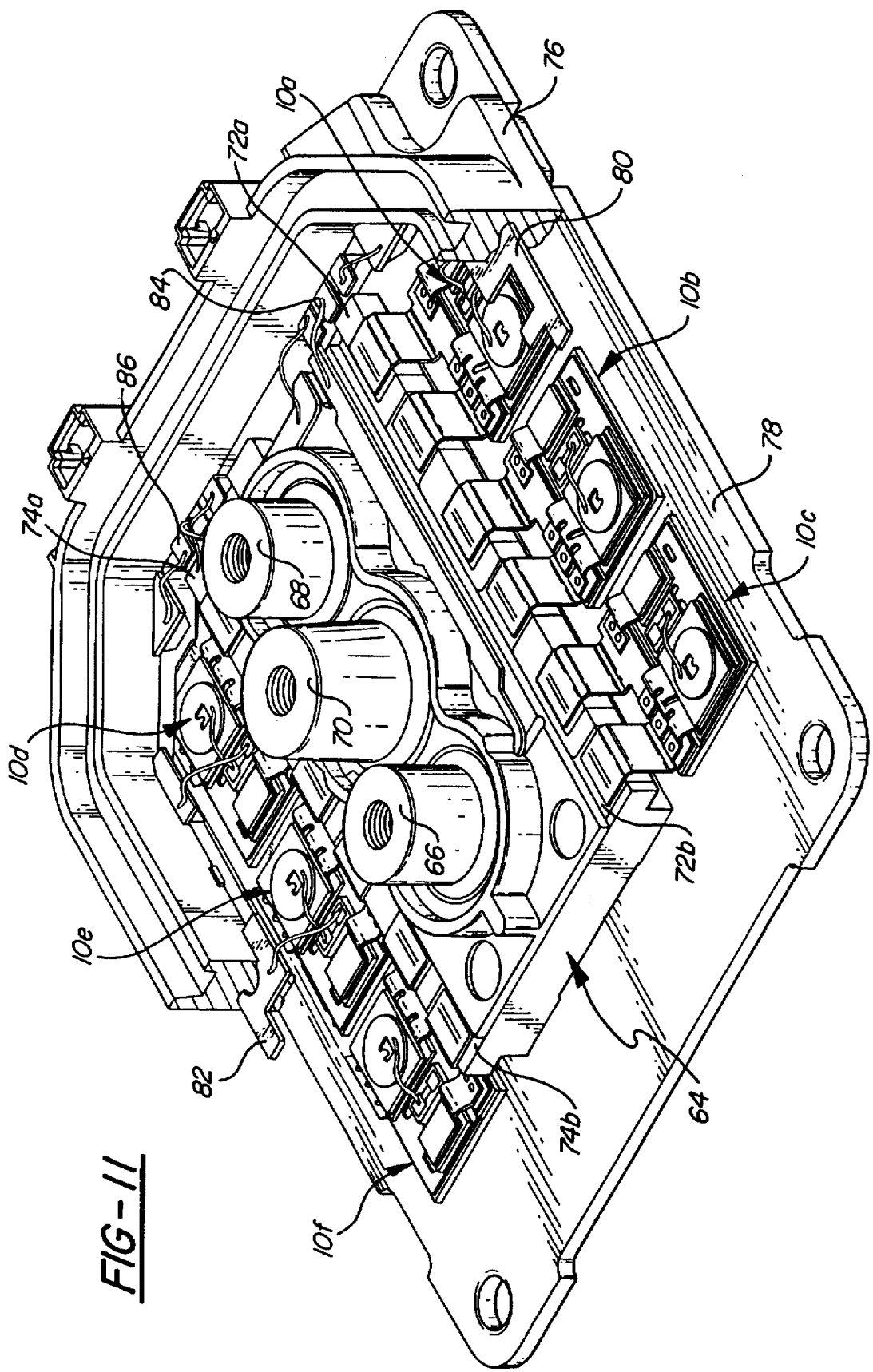

FIG. 11 shows perspective view with parts broken away of the dual switch module shown in FIG. 10.

DESCRIPTION OF THE PREFERRED
EMBODIMENTS—OVERVIEW

As with the substrate subassemblies of U.S. Pat. No. 5,492,842 and U.S. Pat. No. 5,539,254, the substrate subassemblies of this invention can be used in a concentric single and dual switch modules, as well as in linear single and dual switch modules, which are described in those and the other related patents identified above.

This description describes details of the improved semiconductor contact system, which has a particularly special utility in a high substrate subassembly. For completeness, this description also contains a specific example of a module in which the improved substrate subassembly can be used. The specific example is a linear dual module with coplanar inner terminal contacts, along the lines of the module described and claimed in U.S. Pat. No. 5,523,620 Eytcheson et al. However, it is to be understood that the subject substrate subassembly can be used in a variety of module types, including concentric single and dual switch modules, as are as described in U.S. Pat. No. 5,563,447 Lake et al. and in others of the Related Patents.

In the concentric dual switch module input and output terminals are essentially concentric. The terminals have overlapping integral circumferential flanges. In such a module, a plurality of substrate subassemblies are symmetrically circumferentially arrayed around said flanges, in close radial proximity to said flanges. In the linear module, input and output terminals are pairs of overlapping flat plate-like conductors. Each plate in each pair has a linear edge generally registered with the other plate edge of the pair.

In the linear dual switch module, a first row of contacts for one terminal pair are laterally disposed from, and generally parallel to, a second row of contacts for a second terminal pair. A first parallel row of substrate subassemblies, preferably equally spaced, is disposed close to first row of contacts. A second parallel row of substrate subassemblies, preferably equally spaced, is disposed close to the second row of contacts. A parallel row of input/output terminals for the module is disposed generally mid-way between the parallel rows of contacts.

As indicated in the prior U.S. Pat. No. 5,492,842 and U.S. Pat. No. 5,539,254, the substrate subassemblies of this invention permit important chemical, mechanical and electrical considerations to be combined in a very special way to obtain a high power/high frequency switch of low inductance. This special interdependency is not believed to be readily apparent, or understood, merely from a simple description of the substrate or the substrate subassembly alone. The function and interdependency of the substrates and substrate subassemblies to the whole module which they comprise will be described herein as well.

The methods of this invention include preassembly of composite connector strips, and the use of such preassembled composite connector strips Input and output connections to the power chip of the substrate subassembly, and to its companion soft fast diode (SFD) chip if it is also present, can easily be consistently made in a uniform way. This insures more equal, i.e., uniform, impedance among all input leads and all output leads, respectively, and a similarity in impedance between input and output leads. Such uniformity and similarity in input and output leads of the substrate subassemblies play an important role in obtaining compositional and geometrical symmetry in a switching transistor module. Accordingly, if the power chips are electrically matched before mounting in such a substrate subassembly, they are more likely to remain matched after mounting and connections made to them. Moreover, even if not quite matched as-mounted and connected, the substrate subassembly has means to readily tailor input/output performance to a desired match.

This invention simplifies manufacture of the subassemblies and of modules containing them. Many substrate subassemblies can be readily made to have a similar impedance. Hence, this invention has the further advantage of promoting high volume manufacture of improved substrate subassemblies, and of modules containing them, that have a high degree of compositional, geometrical, and electrical symmetry. In addition, electrical leads from power chip to module input and output terminals are short, which further reduces parasitic impedance effects in the module. As a result, closely matched high power substrate subassemblies can be readily grouped in parallel in a power module, to produce a module with highest power rating.

In the past, a plurality of filamentary wires were used make connection to the semiconductor chip upper surface on the substrate subassembly. Each wire was bonded at one end to the chip and at the other to a contact pad. Making so many connections is time consuming and can lead to performance and/or durability variations among substrate subassemblies, especially if produced by different wire bonding machines. This invention substitutes a single soldered preassembly for the filamentary wires. Because of its greater simplicity, the improved substrate subassembly of this invention would statistically be more durable. The soldered preassembly can be uniformly made to a predetermined configuration that provides enhanced durability and also enhanced symmetry between input and output of the substrate subassembly. The improved chip connection of this invention is simple, highly reproducible and short. As with the prior substrate subassembly, the improved substrate subassembly can be tested at a significant power level and matched before more value is added by assembly into a working module. This is called pre-testing herein. The substrate subassemblies can then be sorted into performance categories before mount in the module. Not only can rejects be identified early, but better matching of performance levels is obtained in any given module. Eliminating rejects early obviously reduces manufacturing cost. However, a product improvement also results. Matching the individual performance levels of the chips as mounted and connected, allows more chips in the module to operate closer to their maximum performance level and/or improves durability of module operation. Making as many aspects of the substrate subassemblies as similar as is practical also helps provide compositional and geometric uniformity in the module.

Compositional and geometrical symmetry in input and output conductors provides uniformity in current flow to and from all paralleled devices in the module. This, of course, also requires that the switching transistors be matched well in their performance as mounted and connected, and that they all receive essentially the same control voltage. The substrate subassembly concept of this invention permits easier acquisition of such similarities. It also makes it economically practical to use beryllium oxide as a substrate material in large modules, and even allows the beryllium oxide thickness to be increased enough to reduce parasitic capacitance effects in the resultant module.

The benefit of compositional and geometrical symmetry in input and output conductors is uniformity in input/output current flow among switching devices in the module. Such similarity is not only important from a module durability standpoint. It is also important from a module impedance standpoint. If input and output current is matched and input and output conductors are closely spaced, conductor inductance cancellation can be achieved. Aspects of this are claimed in the above-mentioned U.S. Pat. No. 5,563,447, U.S. Pat. No. 5,519,253, and U.S. Pat. No. 5,444,295. In this invention, it is believed that this improved chip connector preassembly enhances inductance cancellation in the substrate subassembly by improved parallelism and proximity with the power chip collector connector. It is also believed that enhanced durability and reliability results from the single strip of copper that makes the connection with the power chip emitter.

As mentioned, electrical symmetry is important. The shape and size of the module input and output conductors, at least in their intermediate portions, should be closely related, to provide geometrical symmetry. Hopefully, the input and output conductors are as similar in configuration and/or conformation as practical, or at least complementary enough to allow them to be disposed a closely spaced relationship. The type of close disposition envisioned here is one in which the parts fit together or nest together, with a dielectric layer (that is as thin as is practical) spacing them apart. If the conductors are linear, they should preferably be at least generally parallel and non-contiguously closely spaced. In geometrical symmetry, a preferred symmetry might be that input conductor parts are in conformation and/or configuration, so that they might have similar inductance properties in corresponding parts. This can be enhanced if the input and output corresponding parts are of similar composition. When the completed module is operated, the goal is to have as much of the input and output current be parallel, close, and similar as possible, through corresponding parts of the input and output conductors extending between the chip the electrical bus to which the module is connected. This close parallel proximity of geometrically similar input and output conductors, thus, provides the second aspect of electrical symmetry desired in the substrate subassemblies of this invention, and the modules in which they are used as well.

As hereinbefore indicated, when the input and output conductor portions are placed in close parallel proximity, current flow in those portions is parallel but opposite in direction. The close proximity of the opposed current flows, allows the inductance of one current flow to at least partially negate, and even substantially cancel, inductance of the other current flow. Substantial reductions in inductance have been achieved using this effect, even in the substrate subassembly itself. This is an important second aspect of electrical symmetry.

A third aspect of electrical symmetry is the matching of finished substrate subassemblies in a given module. Matching operating characteristics is important from a durability or reliability standpoint too. If the impedance of one switching transistor is significantly less than that of other paralleled switching transistors, that one switching transistor tends to hog more and more current, until switching transistor failure. Such action can occur very rapidly. For this reason, kelvin connections are often desired in the module. They can rapidly detect any undesirable change in impedance, and activate module shutdown before catastrophic failure of the module.

Analogously, if the switching transistors in a group are not matched in their maximum current level ratings, all of the group have to be operated at a level compatible with the weakest of the group. In other words, one transistor of a lesser rating in the group can cause all the other transistors to be operated at power levels that are less than their potential. Analogously, especially if the differently performing chips cannot be identified after mount, the whole module may have to be de-rated to reduce the statistical likelihood of field failures.

There is a supplemental facet to the third aspect of electrical symmetry. The supplemental facet is that the matched devices should have matched cooling. Matched cooling is important because a semiconductor device generates heat during operation. If the heat is not removed, the device will increase in temperature. If it increases in temperature, its operating impedance is reduced. With less impedance, it attracts more than its share of current. The higher current, in turn, generates still more heat, which can cause an avalanche effect to catastrophic device failure. Matched cooling means that chip operating temperatures remain matched, i.e., substantially equal, during even extended operation at maximum rated power. Hopefully, chip temperatures remain substantially constant in temperature.

Matched cooling can be achieved by equal cooling of the device chips, or more precisely by equal cooling of the substrates on which they are disposed. It is conceivable that all that is needed is to cool the chips at a somewhat higher rate than the rate at which the chips generate heat. If so, each chip could be cooled at a somewhat different rate. However, the rate should be considerably greater than the rate at which heat is generated by the chip, effective to maintain the chip below a predetermined operating temperature. It would seem, however, that matched cooling would be preferred. It might be obtainable, for example, by symmetrically disposing the substrate subassemblies on a module substrate, and cooling the entire module substrate uniformly, or at least in the module substrate portion where the substrate subassemblies are disposed. Alternatively, one might choose to selectively, but uniformly, cool each area of a module substrate where a substrate subassembly chip is disposed.

The semiconductor switching devices contemplated for the high frequency substrate subassemblies and modules of this invention are preferably and most importantly insulated gate bipolar transistors (IGBTs). IGBTs are capable of significantly higher current densities and switching speeds than insulated gate field effect transistors (IGFETs), which are popularly also referred to as MOSFETs. IGBTs have been the devices of first choice for high power applications. However, prior to the invention of the Related Patents referred to above, IGBT's were not extensively used in large volume applications, because of difficulties in suitably packaging them.

One considerably difficult packaging problem for high frequency IGBT applications was high package inductance. Providing low inductance substrate subassemblies for single and dual switch modules is thus important. A principle application for the subject substrate subassemblies is for dual switch IGBT modules in an three phase inverter for an electric automobile having an AC drive motor. On the other hand, MOSFET (i.e., IGFET), modules can benefit from this invention too. Nonetheless, for simplicity, the following discussion will focus on IGBT modules, because they can benefit the most from this invention.

DESCRIPTION OF THE PREFERRED EMBODIMENTS—DETAILED

Reference is now made to FIGS. 1 and 2. FIG. 1 shows the subject improved substrate subassembly as bonded. FIG. 2 shows an exploded view of the subassembly's component parts. FIGS. 1–2 show a substrate subassembly 10 that comprises a 25 millimeters by 19 millimeters beryllium oxide plate or wafer 12 of about 1 millimeter in thickness. Beryllium oxide is a particularly effective dielectric material for use the base plate of the five layer substrate for the subject substrate subassembly. It has a high thermal transfer coefficient but has a thermal expansion coefficient close to that of silicon. The coefficient of thermal expansion for silicon is about $2.8 \times 10^{-6}$ in/in/oC. The coefficient of thermal expansion for beryllia is about $6.8 \times 10^{-6}$ in/in/oC. Other ceramics could be used if they have a coefficient of thermal expansion generally matching that of the semiconductor power chip, and have an acceptable thermal transfer coefficient for a given application. Aluminum oxide and aluminum nitride are examples of other such ceramics having a coefficient of thermal expansion close to that of silicon. On the other hand, beryllium oxide, also referred to as beryllia, has a thermal transfer coefficient considerably higher. Accordingly, making wafer 12 of beryllium oxide, instead of aluminum oxide or aluminum nitride, allows one to make wafer 12 correspondingly thicker. Aluminum oxide has a coefficient of thermal expansion of $6.6 \times 10^{-6}$ in/in/oC. Aluminum nitride has a coefficient of thermal expansion of $3.3 \times 10^{-6}$ in/in/oC. This, in turn, reduces parasitic capacitance between the metal foil layers 14 and 16 that are respectively bonded to upper and lower faces 12a and 12b of wafer 12. The metal foil layers 14 and 16 are hereinafter described in connection with FIG. 3. Also hereinafter described is the metallized wafer as soldered to the surface of an electrically conductive bottom plate of a module housing. The foregoing contemplates that the semiconductor chips to be supported by the substrate subassembly would be made of silicon, the most common semiconductor material in use today. If the semiconductor chips are to be made of another semiconductor material, a different wafer 12 ceramic material may be preferred, that is selected using the foregoing criteria. This thought also applies to the following discussion regarding other ceramic elements of the substrate subassembly hereinafter described.

Regardless of the size of the housing, or the number of switching transistors disposed in the housing, the face 12a of wafer 12 is only big enough in area to support one switching transistor and necessary associated circuitry (including an SFD, if used), such as for thermal tracking or other symmetry purposes. This reduces the area of the metallized opposite faces of wafer 12, and further reduces parasitic capacitance. It should also be mentioned that the one millimeter wafer thickness mentioned in the preceding paragraph is a nominal thickness, and is a design compromise thickness. It is thicker than usually used, and is thick enough to reduce parasitic capacitance to an acceptable level in a module made as described herein for an alternating current (AC) automotive, i.e., electric vehicle, traction motor application. However, the wafer is not so thick as to unjustifiably raise wafer cost or reduce thermal transfer from the chip to an underlying heat sink or other cooling member. As mentioned. One millimeter is desirable for automotive traction AC motor applications, where one contemplates switching currents above about 135 amps per square centimeter of switching transistor chip active area at frequencies of about 30 kilohertz and at hundreds of volts. For less strenuous applications, a thinner wafer thickness may be acceptable. For more severe applications, a thicker wafer thickness may be desired.

As can be better seen by also referring to FIG. 3, beryllia wafer 12 is metallized on its opposite faces. Upper face 12a is metallized with an upper copper foil plate 14. Wafer lower face 12b is metallized with a lower copper foil plate 16. Copper foil plates 14 and 16 are each about 20 millimeters by 13.5 millimeters and are about 0.25 millimeter thick. Using 0.25 millimeter copper foil for all the copper layers in the subject substrate subassembly, including its composite contacts is a compromise. A thinner copper foil could be used. However, one wants the copper foil to be thick enough to impart enough body or rigidity that the foil elements are readily handleable without damage under high volume commercial production conditions. On the other hand they also form a part of a composite material with beryllia, which composite material is intended to have a coefficient of thermal expansion close to the of the semiconductor chip. Making the copper foil substantially thicker can require the ceramic to be substantially thicker. In most applications this is undesirable. Accordingly, in many applications, a copper foil thickness of only about 0.2–0.3 millimeter is preferred.

The copper plates 14 and 16 are bonded to the opposite major surfaces of beryllium oxide wafer 12 by any acceptable technique. However, direct copper bonding is preferred. Direct copper bonding is a known and accepted practice in which copper oxide is used to bond a copper sheet to a ceramic substrate. Upper copper plate 14 has an integral generally rectangular extension 14t that is about 7–9 millimeters wide and about 14 millimeters long. Accordingly it overhangs wafer 12 more than about 18–20 millimeters. The chip-supporting portions of the copper foil on top of wafer 12 has a metal coating thereon to enhance chip solderability. It can be an electroplated nickel coating of about 2.5 micrometers or more, followed by a 0.05 micrometer or greater gold flash. It could also be of about a 6–10 micrometer coating of silver. A silicon semiconductor switching transistor 18, such as an insulated gate bipolar transistor (IGBT) or an insulated gate field effect transistor (MOSFET), is disposed on the exposed, i.e. upper, major surface of upper copper plate 14. A soft, fast silicon semiconductor diode (SFD) 20 is also disposed on the exposed major surface 14a of upper copper plate 14, next to switching transistor 18. The SFD is a diode, not an insulated gate device or a high powered semiconductor switching transistor.

The diode chip 20 forms a blocking diode across the emitter and collector terminals of the switching transistor. It is used to protect the switching transistor 18 by shunting current from temporarily reversed voltages that may occur in the system in which this switch is used. As can be seen from the drawing, each switching transistor 18 is preferably paired with a shunting diode. The transistor chip 18 and diode chip 20 are preferably made of substantially similar semiconductor material, such as silicon, and by substantially similar processes so that they can have substantially similar performance characteristics, including change in initial characteristics with change in temperature. Still further, each shunting diode 20 is disposed in close thermal proximity to its switching transistor 18 so that the pair would experience a similar temperature environment. This aids in providing more consistency in operation of the resulting switch.

As indicated above, when IGBTs are used for switches, they cannot be satisfactorily used by just turning them on and off once for each sine wave cycle they are to cover. These devices turn "on" hard, which produces a square wave, not a sine wave. To get appropriately configured sine wave output, IGBTs are turned "on" and "off" very rapidly, many times during each sine wave cycle, using increasing and then decreasing gate to emitter waveform duty cycle. Turn on/turn off frequencies of 20,000–30,000 Hz are not unusual for automotive traction motor applications. As previously indicated, the parasitic inductance associated with such rapid switching is so significant that it has heretofore prevented high power IGBTs from being extensively used. This invention reduces such parasitic inductance to a low level.

As indicated above, a plurality of matched substrate subassemblies 10 would normally be used in parallel for high power switches. Each substrate subassembly 10 has a switching transistor 18 paired with an SFD diode 20. Six such pairs are electrically paralleled to form the dual linear switch module shown in FIGS. 10–11. Others might think that the foregoing indicates all the transistors in a multiple switching transistor module should be mounted on a common ceramic substrate. However, as indicated in the Related Patents, if all the transistors are mounted on a common substrate, the substrate becomes unduly large in area and complexity. Masking of the substrate for selective metallization may be required. Such a large area would tend to increase parasitic capacitance between the top metallized surface of the ceramic substrate and a conductive backplate on which it will be disposed. The large area may also preclude use of beryllium oxide, even though its higher thermal transfer rating might allow a higher current rating and/or produce a lower parasitic capacitance in the resulting module. Increased complexity, that would be inherent to the large substrate, reduces yields of the large substrate, and thereby increases its cost.

Accordingly, this substrate subassembly contains only one switching transistor. In other words each switching transistor is disposed on its own substrate, which allows each substrate to be smaller and simpler. Substantially the entire substrate faces 12a and 12b can be metallized, without appreciably increasing parasitic capacitance. This eliminates masking for metallization. Elimination of masking, further reduces cost. Yields of transistor groups will increase, because if any one semiconductor pair is imperfectly mounted, it can be discarded without also requiring the discarding of other pairs in which it is grouped. In addition, the mounting of a smaller substrate onto the housing bottom plate is easier, and more readily fixable if the initial mount is not satisfactory. Accordingly, yields can increase still further. Increased yields, of course, mean lower cost products, and indirectly superior products.

A corollary to the foregoing is that such cost reductions tend to make use of beryllium oxide even more practical for larger volume use. Hence the attendant increase in module performance becomes more practical for commercial production applications, and improved products more available to the public.

Reference is again made to FIG. 3. FIG. 3 shows that a second but smaller ceramic wafer 24 is bonded to the upper surface 14a of upper copper foil plate 14. Ceramic wafer 24 is preferably of the same material as ceramic wafer 12. However, it is recognized that wafer 24 need not have the same high heat transfer properties as wafer 12. Also, since wafer 24 is not disposed over or under a semiconductor chip, its coefficient of thermal expansion may not be as important in some applications as others. However, it is preferred that wafer 24 be of the same ceramic, beryllia, as wafer 12. Hence, wafer 24 could also be of alumina or aluminum nitride, or still other ceramics.

A third copper foil member 26 is bonded to the upper surface 24a of the smaller beryllium oxide wafer 24 by any acceptable technique. The third copper foil member is contoured to match the upper surface 24a of the second beryllium oxide wafer 24. Hence, it is correspondingly smaller than the copper foil plates 14 and 16. As in U.S. Pat. No. 5.539,254 Eytcheson et al., U.S. Pat. No. 5,523,620 Eytcheson et al. and U.S. Pat. No. 5,492,842 Eytcheson et al., wafer 24 only occupies a minor portion of the metallized surface of wafer 12. In general terms, it is only big enough to accommodate the electrical contacts to be made to it and to support the copper foil tab 26t extending from it. Accordingly, copper foil member 26 can be referred to as a contact plate. If wafer 24, and its covering portion of contact plate 26, is kept as small as is practical relative to wafer 12, the overall size of wafer 12 can be kept as small as is practical. As indicated above, keeping wafer 12 of smallest practical size has electrical and manufacturing advantages.

By way of example, copper foil contact plate 26 could be about 20 millimeters long, about 2–4 millimeters wide and about 0.25 millimeter thick. Copper foil contact plate 26 has an integral generally rectangular extension 26t that is about 7–9 millimeters wide and about 18–20 millimeters long. Tab 26t is laterally offset from tab 14t but is otherwise similar in size and configuration to tab 14t. Tab 26t thus overhangs wafer 24 more than about 18–20 millimeters. It should also be mentioned that one might choose to pre-bend tabs 14t and 26t up at 90 degrees with respect to copper plate 16 prior to solder mounting the substrate subassembly to the backplate of a module (not shown). This, in combination with a second 90 degree bend (not shown) at module terminal contact height, would provide for stress relief between the substrate subassembly and a module terminal, as well as facilitate handling of the substrate subassembly during soldering. Copper foil contact plate 26 can be bonded to the smaller wafer surface 24a, and the smaller wafer 24 be bonded to upper copper foil plate 14, at the same time that foils 14 and 16 are bonded to wafer 12. As indicated above the preferred form of bonding is direct copper bonding.

It is also to be recognized that smaller ceramic wafer 24 could be of a greater or lesser thickness than one millimeter, depending on the application in which it is used. Since, wafer 24 does not have to support the rigors of wire bonding in this improved substrate subassembly, a thickness of only 0.5 millimeter or less might be preferred. On the other hand, wafer 24 is preferably thick enough to be durable both before and after assembly. Analogously, for some applications, the layer of ceramic formed by wafer 24 might be replaced with an insulating coating on upper copper plate 14. The coating would presumably be of ceramic that is selected using criteria mentioned above. However, it is conceivable that it might be a different insulator material, as for example polyimide, provided that contact plate 26 could be bonded to it. Hence, the insulating layer that wafer 24 provides need not necessarily be a discrete wafer nor of ceramic. On the other hand, making layer 24 a discrete ceramic wafer simplifies manufacture of the resulting five layer substrate, and may provide maximum durability, as the substrate subassembly is currently envisioned. As indicated above, the five layer substrate preferably has a thermal coefficient of thermal expansion approaching that of the semiconductor chips it supports, particularly the power chip.

Continuing reference to FIGS. 1–3, it is to be noted that upper copper foil plate 14 has perforations, or slots, 28a–28f cut through it. These slots perform an automatic chip alignment function when semiconductor chips 18 and 20 and resistor chip 22 are soldered to copper foil plate 14. The chips could be mounted on plate 14, for example in a reflow solder operation. The left hand edge of slots 28a and 28b, as seen in FIGS. 1–3, cooperate with the left and forward edges of plate 14 to locate the power transistor chip 18 in the desired position on the surface of plate 14. The right hand edges of slots 28a and 28b cooperate with slots 28c, 28d and 28e, and also with slot extension 28a', to precisely locate resistor chip 22 on plate 14, and to concurrently space it from transistor chip 18. The right hand edges of slots 28d and 28e cooperate with slot 28f and the right hand edge of plate 14 to precisely locate diode chip 20 on plate 14, and to concurrently space it from resistor chip 22. Hence, the soldering of these chips to plate 14 is simplified but highly precise. Precise alignment is desired to minimize the size of the substrate subassembly, and yet allow just enough room for a wire bonder head to have easy access to the resistor chip 22.

It should be recognized that in this invention slots are a referred to in both plate 14, and later in copper strip 36. The slots are present to produce areas on the copper surface not wetted by molten solder. The slots alternatively could be replaced by a coating on the copper surface not wetted by molten solder. For example, if the copper plate 14 were not on a dielectric substrate but suspended in air, the air gap formed by the slots would function like a dielectric coating in containing the flow of solder.

As indicated above, a switching transistor chip 18 such as an IGBT is mounted on plate 14, preferably by soldering. Such a chip will have a plurality of input electrode areas 30 on its surface. In an IGBT chip the contact areas 30 make low electrical resistance connection with the emitter region of the IGBT chip. Such a chip also has a central gate electrode area 32 that makes a low resistance electrical connection with the gate region of the IGBT chip.

In the prior U.S. Pat. No. 5.539,254 Eytcheson et al., U.S. Pat. No. 5,523,620 Eytcheson et al., and U.S. Pat. No. 5,492,842 Eytcheson et al., electrical contact to these ares was made by bonding filamentary wires to them. In this invention, the filamentary wires are replaced by a single conductor strip 34. Conductor strip is not only readily soldered to all input contact areas of the chip but also concurrently soldered to the contact plate 26. while the following discussion focusses on using this contact system in a high power IGBT substrate subassembly, it is to be understood that this contact system could be used for any contact for any semiconductor chip in any application of any power rating.

Also, it is to be noted that in the example all connections between chip 18 and plate 26 can be made in a single soldering operation. On the other hand, it is to be also noted that there may be applications where it is not preferred to solder all the parts together in one operation. For example, there may be applications where one prefers to mount the chips first. In such instance, the conductor strip 34 would be mounted to the contact areas on the upper surface of the chip in a later operation, preferably using a solder that melts at lower temperature than used in mounting the chip on plate 14. Further, one might prefer to initially form a subassembly of the conductor strip 34 and an overlying ceramic element in one operation, form another subassembly of the chip on plate 14 in a second operation, and solder the two subassemblies together in a third operation. The third operation would preferably use a solder that melts at a lower temperature than used in forming the subassemblies. Other soldering permutations of these parts can also be envisioned, and are included within the scope of this invention.

This contact is also believed to have an advantage in current flow across the top of a semiconductor chip. For example, an IGBT chip normally has many cells, the emitter contact for each of which is on the top side of the chip. Previously, the emitter contact was "wire bonded". By this is meant that a filamentary wire is ultrasonically or thermocompression bonded to a thin aluminum or aluminum alloy film that forms an electrical contact area on the surface of semiconductor chip. Use of the wire bonded connection required current to flow up from the chip bottom side through the thickness of the cells, across the chip's thin top metalization layer of each cell to the point of contact between the filamentary wire and the metallization layer for that cell. The current gathers at the wire bond and then flows through the filamentary wire to the module terminals. This current flow across the top side metallization on the IGBT causes current crowding at the point where the filamentary wire is bonded to the aluminum metallization, i.e., the "wire bond foot". More current at this crowded area increases the heat in this area, and the individual cells of the IGBT do not necessarily conduct current uniformly. The larger emitter contact this interconnect provides, virtually insures uniform current flow through all the cells of the IGBT. Such localized heating is believed to be virtually eliminated. The large top side contact area of this interconnect, also acts as a top side heat sink to further temper non-uniform junction temperatures at the chip's surface, which might result from reasons other than current crowding, such as solder voids on the bottom side of the chip. This results in improved IGBT characteristics such as RBSOA (reverse bias safe operating area) and SCSOA (short circuit safe operating area).

Referring now to FIGS. 4–6, as well as to FIGS. 1–2, it can be seen that the conductor strip 34 is actually a unique preassembly. It has a unique composition in that it is formed of a 0.15 millimeter thick copper strip 36 partly laminated to or with a third, and still smaller ceramic wafer 38 about 0.64 millimeter thick. In that sense, the conductor strip 34 is of a composite material. The center part of ceramic wafer 38 is, in turn, covered with a circular disk of copper foil having a thickness of about 0.15 millimeter. The disk is circular so that it provides an appropriate wire bondable surface regardless of it theta orientation. This simplifies preassembly of the composite conductor. In this case it was desirable to locate the circular disk 40 with the gate contact tab 40b piloting through the hole 42 in the ceramic wafer 38. On the other hand, it is to be recognized that there may also be advantages in other cases to have a larger hole or window 42 through the ceramic wafer 38, and not use window 42 to locate the contact tab 40b. In such instance, tab 40b could be suitably located within the larger window 42 by using the outer periphery of disk 40. Making the window 42 larger may have the advantage of allowing one to visually confirm that tab 40b is properly bonded to the gate contact on the chip. Also, although disk 40 is shown to have a circular outer periphery, it could have any convenient plan view shape, including square or rectangular. Any such outer periphery can by used for locating tab 40b in the enlarged window 42.

Another comment to be made about the disk 40, is that in some instances it may be desired to omit disk 40 entirely. For example a gate lead is not needed when the semiconductor chip is a diode. Also, for some applications, it may be preferred to make electrical connection to the gate contact on the chip by wire bonding instead of soldering. Moreover, if electrical connection to the gate contact on the chip is to be made by wire bonding, the window 42 in ceramic 38 would have to be larger to accommodate the wire bonding head. Still further, other permutations regarding the window 42 and disk 40 can be envisioned. For example, the gate contact on an IGBT or MOSFET chip is not always in the center. It could be on the edge of the chip. In such instance, window 42 would not be in the center of wafer 38. It would be near or at the wafer edge. If at the edge, it could take the form of a notch on the edge of ceramic wafer 38.

The length and width of wafer 38 is about the same as that of chip 18, with which it edges generally register. Wafer 38 has a central aperture registered over the gate electrode 32 on chip 18. The center of the copper foil disk 40 has an opening 40a and in integral finger 40b that extends into the opening 40a. Finger 40b has a portion bent down out of the plane of disk 40. The bent-down portion has a length slightly greater than the thickness of the wafer 38. Wafer 28 has a central aperture 42 through its thickness to accommodate finger 40b. Copper strip 36 has an analogous but larger such aperture. In the conductor preassembly 34, finger 40b is disposed in aperture 42 of wafer 38 and projects through the thickness of wafer 38. Finger 40b makes contact with gate electrode 32 on the center of transistor chip 18 when the conductor preassembly 34 is aligned on transistor chip 18.

Wafer 38 is preferably about 2–5 times thicker than the copper strip 36 or the copper disk 40, preferably about four times thicker, as for example about 0.6 millimeter. It should be thick enough to form a copper and ceramic composite that has a composite coefficient of thermal expansion dominated by the thermal expansion coefficient of the ceramic. On also wants the ceramic to be thick enough to be readily handled without breakage, and to be strong enough to withstand the rigors of wire bonding operations on disk 40.

As mentioned above, a filamentary wire 51 is thermocompression or ultrasonically bonded to disk 40. One end of the filamentary wire 51 is bonded to disk 40. The other end of filamentary wire 51 is similarly bonded to a contact pad 22a on trimmable resistor 22. By trimmable, is meant that the resistor can be trimmed before or after mounting on plate 14. It is preferably trimmed before mounting because it is physically easier to access it before mounting. It is also recognized that resistor 22 need not be actually physically trimmable. The same resistance could be obtained simply by selecting a fixed resistance resistor of the proper resistance for use in the substrate subassembly. Use of such a resistor is considered to be within the scope of this invention. In the case of lower current switching applications, i.e., 200 amps RMS or less, substrate subassemblies probably would not require precise power matched characteristics because only one substrate subassembly, i.e., one IGBT, would be capable of switching all of the current. In such a case, the gate resistor would probably not be required. Even where not needed for matching, this 7.5 ohm resistor 22 is useful to dampen oscillations between paralleled substrate subassemblies,i.e., switches. Trimmable resistor 22 has a second contact pad 22b to which a second filamentary wire is similarly bonded. The second filamentary wire 53 is shown bonded to a part of an embedded lead frame in the module housing shown in FIGS. 10–11. The first and second filamentary wires 51 and 53, thus connect the gate electrode 32 of switching transistor 18 to a source of gate electrode potential in the module.

The wafer 38 in composite conductor 34 is of a dielectric, such as a ceramic, that provides an electrically insulating layer having a thermal coefficient close to that of the transistor chip 18. Transistor chip 18 will in most instances be made of silicon. Accordingly, it is preferred that wafer 38 be of beryllia, alumina, or aluminum nitride. Alumina is most preferred. Alumina may not have as high a thermal conductivity as beryllia but has a thermal expansion coefficient that is nominally closer to silicon than beryllia. It is believed that expansion matching is more important here than thermal conductivity. For a similar reason one might eventually prefer to use aluminum nitride for wafer 38, after sufficient production experience with alumina has been obtained. Layer 38 preferably is a discrete wafer but it must be recognized that it could also be a coating if satisfactorily applied in proper thickness, as for example by plasma spraying. Such a coating might be useful if electrical contact to disk 40 were made by means other than wire bonding or if disk 40 were not used.

As indicated, the width of the copper strip 36 is about the same as the corresponding dimension of the chip 18. It only has to be wide enough to make contact with the input contact areas 30 on chip 18. Copper strip 36 has a length that is slightly longer than the distance between the front edge of chip 18 and the back edge of copper plate 26, as they are shown in the drawing. This provides a length sufficient to permit formation of an arch 36a in copper strip 36 between chip 18 and plate 26. The arch is present for stress relief. FIGS. 4-5 show the conductor preassembly 34 as formed, to indicate that the arch is formed after the preassembly is bonded together and before the preassembly is soldered in place. In some cases, this stress relief might not be required or could be configured in a different manner. One could make alternatively substitute an "S" curve tab for the arch, so that the copper strip 36 is left flat. In a case where the end usage of the resultant product may not be automotive and/or environmental temperature cycles are not a concern, no stress relief such as an arch or "S" bend may be required at all.

As indicated above, the conductor preassembly 34 is preferably made of the same materials used to make the five layer substrate of substrate subassembly 10. The copper strip 36, wafer 38 and copper disk 40 can prebonded together by any acceptable technique. Direct copper bonding is preferred, which is hereinbefore described. The three elements comprising conductor preassembly 34 would be direct copper bonded together in a separate operation prior to soldering it to transistor chip 18 and copper contact plate 26. Keeping the copper strip 36 flat during bonding simplifies the bonding.

Diode chip 20 also has a composite conductor, indicated by reference numeral 44, that has similarities to the power transistor's composite conductor 34. The diode composite conductor 44 can be better seen in FIGS. 7-9, as well as in FIGS. 1-2. As with composite conductor 34, composite conductor 44 is formed of a 0.15 millimeter thick copper foil strip 46, to which a ceramic wafer 48 is direct copper bonded. The width of copper strip 46 and ceramic wafer 48 are about the width of the contact area 50 on top of the diode chip 20. The length of the wafer 48 is about the length of the diode contact area 50. When composite conductor 44 is soldered in place, wafer 48 generally registers with contact area 50. The length of the copper strip 46 is slightly longer than the corresponding distance between the front edge of diode chip 20 and the back edge of the contact plate 26, as they are shown in the drawing. This provides a length sufficient to permit formation of an arch 46a in copper strip 46 between chip 20 and plate 26. The arch is present for stress relief. FIGS. 7-8 show the conductor preassembly 34 as formed, to indicate that the arch is formed after the preassembly is bonded together and before the preassembly is soldered in place.

Composite conductor 44 is preferably made of the same materials and bonded together in the same way as is composite conductor 34, for similar reasons. For similar reasons, copper strip 46 is bonded to wafer 48 while flat and the arch 46a formed in it after the bonding. It should also be mentioned that for convenience and simplicity at this time, wafer 48 is preferably of the same absolute thickness, and same relative thickness to copper strip 46, as ceramic wafer 38 is to copper strip 36. However, it should be recognized that the requirements for connection to diode chip 20 are not as stringent as for the connection to power transistor chip 18. Alignment to the top side of a diode is not very critical because there is only a single contact area and no gate contact to align with. The power handling stresses are usually less. However, the environmental temperature cycles, in automotive use, still require materials with closely matched TCEs. In addition, there is no covering layer of copper foil, such as disk 40 on wafer 38. Also, wafer 48 does not need to support wire bonding operations. It is to be expected that in many applications, wafer 48 could be thinner than one millimeter, and even less than 2 times the thickness of copper strip 46. One might eventually consider it preferred in some applications to form ceramic layer 48 in a suitable thickness by a coating technique instead of a discrete ceramic wafer.

The copper strips 36 and 46 in the composite conductors 34 and 44 also have some additional unique aspects not described above. The additional unique aspects of copper strip 36 can be seen in connection with FIGS. 1-2 and 4-6. It can be seen that end 36b of copper strip 36 extends beyond chip 18 and has an upward bend. Also, an upward bend on either side of arch 36a in copper strip 36 is the beginning of the arch 36a. The copper strip 36 is flat between the upwardly bent end 36b and the upward bend of arch 36a facing end 36b. The distance between these two upward bends is about the same as the front to back dimension of the transistor chip 18. This distance forms a part of a coordinated automatic alignment system for composite conductor 34 on transistor chip 18, and on contact plate 26 as well. The alignment system uses surface tension of melted solder to produce and maintain alignment during reflow soldering.

The back side of the chip 18 forms a collector region for the switching transistor 18, which region is in low resistance electrical communication with copper plate 14, as by soldering or the like. As indicated above, the upper surface of switching transistor 18 is divided into a multiplicity of copper or copper alloy coated aluminum or aluminum contact areas 30 to reduce emitter series resistance. In this example, there are eight such areas. They surround a smaller rectangular copper or copper alloy coated aluminum or aluminum alloy gate electrode 32, also referred to as a gate contact area 32. All of these areas are coated with copper or a copper alloy to enhance solderability. The eight rectangular areas are generally uniformly spaced. Copper strip 36 has longitudinal slots 52a, 52b and 52c extending through its thickness. These slots are on a centers that have the same spacing as the centers for the grid lines 54a, 54b and 54c between rows of contact areas 30 on transistor chip 18. The slots serve to maintain transverse centering of composite conductor 34 on transistor chip 18 during reflow soldering of composite conductor 34 to the contact pads 30 on transistor chip 18. It is maintained by surface tension of the solder.

It can also be seen that the middle slot 52b has a central enlargement in it that is larger that gate electrode 32. The slots 52a, 52b and 52c provide automatic transverse location of copper strip portions over the contact areas 30 of chip 18 and of the center of slot 52b over the center of gate electrode pad 32. This action provides transverse alignment of copper strip 36 of composite conductor 34 on chip 18. However, transverse alignment is not all that is needed. Longitudinal alignment is also needed. In this invention, longitudinal alignment is also obtained by surface tension effects of molten solder. The two upward bends in copper strip 36 that are referred to above provide longitudinal alignment. They are at strip end 36b and the facing side of arch 36a. These bends coact with molten solder by surface tension effects to longitudinally center contacts 30 of chip 18 in the flat portion of strip 36 between the bends. Without copper strip extending past wafer 38 and having and upward bend at 36b, the upward bend starting the arch on the other side of wafer 38 can produce a surface tension effect that would longitudinally move composite conductor strip 34 during soldering. Upward bend 36b produces an opposite effect, as a result, copper strip 36, and composite conductor 34, becomes longitudinally properly aligned. In other words, one might say that this provides a longitudinal centering of the ceramic wafer, and inherently the disk contact finger 40b, over the gate electrode 32 on transistor chip 18. Bend 36b is preferably on about the same radius as the bend starting the arch 36a, in an effort to obtain a maximum in the centering effect. The two bends are spaced apart about the same distance as the corresponding dimension of chip 18, and slots 52a–52c provide a transverse centering effect. Accordingly, composite conductor 34 is placed anywhere close to correct positioning at the start of soldering, it locates on the contact pads 30 and stays there until the solder hardens after soldering.

The soldering can be accomplished in a any satisfactory method. For example, solder can be supplied to the soldering interface by any acceptable suitable technique for a given application, such as by screening solder paste onto the chip and contact plate 26 surfaces, by using solder preforms, or the like. Solder can also or alternatively be applied to contact areas of the lower surface of the composite conductors 34 and 44 of this invention. In addition, it is known to be desirable to precoat either or both surfaces to be soldered with a suitable material that will enhance wettability of the solder to those surfaces. In some applications, precoating with silver, may be desired. In other applications, other coatings or alloys may be preferred.

Stress relief of another sort is also provided in copper strip 36. It is provided by end slots 56 that form end fingers on copper strip 36. This not only provides stress relief for the soldered connection of strip 36 to contact plate 26 but also provides added edge area for solder to wick up and form a fillet with the edge of strip 36. Analogously, apertures 58 are disposed between the slots 56 that provide still more edge area where solder can form a fillet and produce enhanced solder locking of strip 36 to plate 26. Apertures 58 would also provide some added lateral stress relief in the soldered area of strip 36 on plate 26. The number and size of slots 56 and apertures 58 is each a compromise. A slot width and/or aperture diameter of about 1–2 millimeters perhaps might be used. One wants enough void area in the end of copper strip 36 for stress relief and solder adhesion but not so much as to physically weaken the end the copper strip. For similar reasons, slots 56 in the end of copper strip 36 are preferably relatively short. They do not extend much into the arch 36a.

This short length allows a higher physical integrity, i.e., rigidity, in the fingers in the end of copper strip 36. If the slots 56 were longer, wider, or more numerous, or the apertures 58 too big, the resulting fingers in the end of copper strip 36 could become flimsy. This would make the handling of copper strip 36 and the composite conductor 34 more difficult. Flimsy fingers could bend during handling, and would have to be straightened. In some instances, flimsy fingers could become damaged beyond repair, or even broken off, requiring the copper strip or the composite conductor to be discarded. Such discards, and the added care required in handling a composite conductor with flimsy fingers, add to manufacturing costs. Hence, they may be undesirable. However, in the case of a highly automated assembly line, proper tooling might provide for handling longer contact fingers 56 which might provide an even better stress relief for the solder joint between strip 36 and plate 26 in the lateral direction of stress.

Copper strip 36 has still another unique feature not obvious from the above. Slot 52b is longer than slots 52a and 52c. Slot 52b extends into the arch 36a, up to about the top of the arch 36a. Also, copper strip 36 has two more short slots 60a and 60b that are transversely disposed on either side of slot 52b. Slots 60a and 60b are longitudinally appropriately disposed in copper strip so that they will be located at the top of arch 36a. It can also be seen that they are aligned with aligned with slots 56 in the end of copper strip 36. However, they are transversely disposed so that they are not aligned with slots 52a or 52c. Instead the 60a is aligned between slot 52a and 52b. Slot 60b is aligned between slot 52b and slot 52c. Slots 60a and 60b and the extension of slot 52b are present in copper strip 36 primarily to accommodate a manufacturing process step performed on the substrate subassembly after soldering. In that step, the substrate subassembly 10 is given a viscous protective coating, after the substrate subassembly is substantially otherwise completed. It is desired to have the protective coating cover all of the substrate subassembly, even under the arch 36a. On the other hand, copper strip 36 is relatively wide. Consequently arch 36a is relatively wide. Slots 60a and 60b and the extension of slot 52b into arch 36a prevent the protective coating from trapping air under the arch 36a. As a result, the viscous protective coating will flow better under the arch 36a, to insure formation of a continuous protective coating on the substrate subassembly, even under the wide arch 36a. Once again, stress relief in the lateral direction on copper strip 36 is also a benefit and provided for by the overlapping, end-to-end of slots 52b, 60a and 60b, minimizing stress on the interface of strip 36 and wafer 24 as well as the solder joint between plate 26 and strip 36.

Reference is now made to the composite conductor 44 for the diode chip 20. Diode chip 20 only has only one relatively large contact area. It is thus relatively easy to make electrical contact to it. Composite conductor 44 needs no special means for enhancing alignment because alignment is not particularly critical. Composite conductor will automatically align well enough on contact area 50 during soldering, due to surface tension effects of the molten solder. In addition, the width of diode chip 20, as compared to that of transistor chip 18, is relatively small. Accordingly, there is no special need for apertures in arch 46a for air release under arch 46a when applying the protective coating in the final steps of manufacture of the substrate subassembly 10, and or for added stress relief in the arch area 46a. On the other hand, it is preferred to provide some extra solder locking in the soldered end 46b of copper strip 46. Since copper strip 46 is not as wide as copper strip 36, the solder locks used need not be as extensive as for copper strip 36. The use of apertures 62 for solder locking is preferred, instead of slots or slots and apertures, for reasons such as explained above. Apertures do not form fingers in the end 46b of copper strip that could bend or break. The particular preferred diameter of apertures 62 for any given application is usually a compromise, as indicated above for copper strip 36. One might consider using a diameter of about 1–2 millimeters for apertures 62.

As indicated above, an IGBT switching transistor 18 is usually paired with a soft fast shunting diode (SFD) 20 in the subassembly 10 of this invention. In addition, in some instances on might also want to include "kelvin" connections (not shown) in the improved subassembly of this invention, or in a module containing the improved substrate subassemblies. Kelvin connections are amply explained in the Related Patents and are therefore not treated here. However, it is to be understood that they might be used with the substrate subassembly of this invention if so desired.

Reference is now made to FIGS. 10 and 11, which show six substrate subassemblies of this invention that contain matched transistor/diode pairs. However, one can see that six are grouped together in two groups of three. Each group is in a line, and the members of each group are electrically paralleled to form one switch. Accordingly, FIG. 10–11 show a dual in-line switching module. The transistors and diodes in each group are initially tested and sorted before mounting on their discrete substrates. After mounting, each transistor/diode pair is tested and sorted as a mounted pair. Similar mounted pairs are then matched and placed in three member groups. Accordingly, output characteristics of each substrate subassembly, i.e., each mounted pair, in each group will be substantially the same, to provide the symmetry discussed above. In addition, it is highly preferred that all the substrate subassemblies in both groups be matched.

Except for the improved substrate subassembly of this invention, the module shown in FIGS. 10–11 is essentially the same as that described and claimed in U.S. Pat. No. 5,523,620 Eytcheson et al. Since that description is already incorporated herein by reference, the module of FIGS. 10–11 shall only be described briefly here.

The module has a terminal subassembly 64 that includes an emitter terminal 66 for substrate subassemblies 10a, 10b and 10c, a collector terminal 68 for substrate subassemblies 10d–10f, and a common collector/emitter terminal 70 for both substrate subassembly groups. Terminal subassembly 64 has a row of coplanar contacts 72a and 72b on its right side. It has a second row of coplanar contacts 74a and 74b on its left side. The contact rows 72a–72b and 74a–74b are parallel, as are the two lines of substrate subassemblies 10a–10c and 10d–10f. The contacts 72a are in low electrical resistance communication with emitter terminal 66. The contacts 74a are in low electrical resistance communication with collector terminal 68. The contacts 72b and 74b are in low electrical resistance communication with collector/ emitter terminal 70. Substrate subassembly tabs 14t of substrate subassemblies 10a–10c are welded to terminal subassembly contact areas 72b. Substrate subassembly tabs 26t of substrate subassemblies 10a–10c are welded to terminal subassembly contact areas 72a. Substrate subassembly tabs 14t of substrate subassemblies 10d–10f are welded to terminal subassembly contact areas 74a. Substrate subassembly tabs 26t of substrate subassemblies 10d–10f are welded to terminal subassembly contact areas 74a.

The module has a housing that has a heat conductive bottom plate 78 having a coefficient of thermal expansion close to that of the substrates in the improved substrate subassemblies 10 of this invention. The cover, not shown, of housing 76 is not shown to better illustrate the interior construction of the module. Housing 76 has two embedded lead frames, 80 and 82, portions of which are exposed within the module for electrical connection. Housing 76 also has two small connector areas, which are shown to the right and left at the top of the drawing. Each small connector area has two kelvin terminals and a gate voltage terminal. The gate voltage terminal for the substrate subassemblies 10a–10c is indicated by reference numeral 84. The gate voltage terminal for the substrate subassemblies 10d–10f is indicated by reference numeral 86. Filamentary wires connect gate terminal 84 to embedded lead frame 80. Filamentary wires connect gate terminal 86 to embedded lead frame 82. Filamentary wires connect embedded lead frame 80 with the resistor chip on each of substrate subassemblies 10a–10c, connecting it to gate terminal 84. Filamentary wires connect embedded lead frame 82 with the resistor chip on each of substrate subassemblies 10d–10f, connecting it with gate terminal 86.

In the linear construction shown in FIGS. 10–11, the aforementioned input and output terminal parallelism and overlap are extensively used.

FIG. 11 shows a fragmentary perspective view of the module of FIG. 10. The substrate subassemblies 10 are shown after they are mounted on the baseplate 78. Three substrate subassemblies 10 are soldered to the upper surface of module baseplate 78 on one side of the terminal subassembly 64. Three more are soldered to the upper surface of module baseplate 78 on the other side of terminal subassembly 64. Each group of three is along a line parallel to the centerline of Terminal subassembly 64. The chip resistors are preferably disposed similarly on each substrate subassembly. Also, the substrate subassemblies are preferably similarly, or symmetrically, disposed on module baseplate 78, to obtain uniformity in cooling, and thereby uniformity in temperature during operation. Maintaining such uniformity in temperature is important because both the active and passive devices can change performance characteristics with temperature.

It is recognized that this invention has been described in connection with certain specific embodiments. On the other hand, it is understood that the basic principles of this invention can take the form of many other embodiments without departing from the spirit of this invention. For example copper foil conductor strips are described herein. Other metals, alloys and/or laminates could be substituted, and in some applications be preferred. It is intended that the claims not be limited to the precise embodiments herein disclosed, but only limited as expressly recited in the claims hereof.

We claim:

1. A durable composite substrate subassembly useful in electronic switching modules comprising:

a ceramic wafer having first and second opposed major faces and a coefficient of thermal expansion close to a thermal expansion coefficient of a selected semiconductor material, said first and second faces being metallized;

a first metal tab on said first metallized face that extends away from the ceramic wafer for electrical connection to a terminal member;

a semiconductor switching device chip of said selected semiconductor material thermally and electrically conductively bonded to said first metallized face, wherein a first region of said device chip is in low electrical resistance connection with said first metal tab;

a first ceramic layer bonded to a portion of said first metallized face adjacent said device chip, said first ceramic layer having a metallized upper surface;

a second metal tab on said metallized upper surface of said first ceramic layer that extends away from the ceramic wafer for electrical connection to a terminal member;

a metal foil conductively bonded to electrodes on an upper surface of said device chip and also to said metallized upper surface of said first ceramic layer, wherein a second region of said device chip is in low electrical resistance connection with said second metal tab, said metal foil having an upper surface; and a second ceramic layer bonded to said metal foil upper surface, said second ceramic layer being disposed over said device chip, said ceramic layer and said copper foil forming a composite material having a coefficient of thermal expansion close to that of said selected semiconductor material;

effective to provide a durable heat conductive subassembly that includes an electrical and thermal connection to an upper surface of said device chip that has a composite coefficient of thermal expansion close to that of said device chip.

2. The composite substrate subassembly as recited in claim 1 wherein the substrate subassembly further includes:

a metallized upper surface on said second ceramic layer; and a low resistance electrical connection between a third region of said device chip and said metallized upper surface of said second ceramic layer;

wherein said metal foil, said second ceramic layer and said metallized upper surface of said second ceramic layer have a composite coefficient of thermal expansion close to that of said semiconductor.

3. The composite substrate subassembly as recited in claim 2 wherein said substrate subassembly further includes an electrical resistance element in series with said third region of said device chip.

4. The composite substrate subassembly as recited in claim 2 wherein said selected semiconductor material is silicon, said switching device chip is a high power IGBT, said metallized faces and surfaces are films of copper, said first metal foil is copper, said ceramic wafer and said first ceramic layer are of beryllium oxide, said second ceramic layer is of alumina, and copper oxide bonds contacting surfaces of said ceramics and said copper.

5. The composite substrate subassembly as recited in claim 4 wherein said device chip is an insulated gate bipolar transistor and the substrate subassembly further includes a semiconductor diode chip bonded to said first metallized wafer face, said diode chip being of said selected semiconductor material.

6. The composite substrate subassembly as recited in claim 5 wherein the substrate subassembly further includes:

a second metal foil bonded to an upper surface of said diode chip and also to said metallized face of said first ceramic layer, said second metal foil having an upper surface; and a third ceramic layer bonded to said upper surface of said second metal foil over said diode chip, said third ceramic layer and said second metal foil forming a composite material having a composite coefficient of thermal expansion close to that of said selected semiconductor material.

7. The composite substrate subassembly as recited in claim 6 wherein:

the ceramic wafer has a thickness of the order of about one millimeter;

the device chip is silicon insulated gate bipolar transistor;

said second metal foil is of copper;

said third ceramic layer is of alumina; and a copper oxide bond joins contacting surfaces of the second metal foil and the third ceramic layer.

8. The composite substrate subassembly as recited in claim 7 wherein:

each metal tab is of copper and is integral with the metallizing copper film from which it extends; and both of said first and second tabs extend outwardly from the same edge of said wafer in closely spaced disposition.

9. The composite substrate subassembly as recited in claim 8 wherein said substrate subassembly further includes an electrical resistance unit in series electrical connection with said metallized upper surface of said second ceramic layer.

10. The composite substrate subassembly as recited in claim 9 wherein said electrical resistance unit is a trimmable resistor supported on said first metallized wafer face, and a filamentary wire provides said series electrical connection between said trimmable electrical resistance unit and said metallized upper surface of said second ceramic layer.

11. A high power module containing a high power semiconductor switching device, said module comprising:

a thermally conductive support plate having a thermal expansion coefficient close to a given coefficient of thermal expansion;

a high power semiconductor switching device composite substrate subassembly including a ceramic wafer having first and second opposed faces that are substantially completely metallized and separated by unmetallized edges of said wafer, said wafer having a coefficient of thermal expansion close to said given coefficient of thermal expansion and being disposed on said support plate with its metallized second face in low resistance thermal and electrical contact therewith;

a high power semiconductor switching device chip of a semiconductor material having said given coefficient of thermal expansion disposed on the metallized first wafer face in low resistance thermal and electrical contact therewith;

first and second terminal members of the module disposed in close proximity to an edge of said wafer;

a first integral tab on said metallized first wafer face that extends away from said wafer edge and connects with the first terminal member, to establish a short low electrical resistance connection of a given impedance between a first region of said device chip and the first terminal member;

a first ceramic layer on said metallized first wafer face adjacent said device chip, said first ceramic layer having a metallized upper surface;

a second integral tab on said metallized upper surface of said first ceramic layer that extends away from the wafer edge and connects with the second terminal member, to establish a short low electrical resistance connection of given impedance between a second region of said device chip and said second terminal member;

a metal foil conductively bonded to electrodes on an upper surface of said device chip and also to said metallized upper surface of said first ceramic layer;

a second ceramic layer on an upper surface of said metal foil over said device chip, said second ceramic layer having a coefficient of thermal expansion close to that of said device chip and providing an electrical and thermal connection to said device chip that has a composite coefficient of thermal expansion close to that of said device chip.

12. The high power module of claim 11 in which the semiconductor switching device chip is an insulated gate bipolar transistor chip.

13. The high power module of claim 12 in which said metallized faces and surfaces are films of copper, said metal foil is copper, and said ceramic wafer and first ceramic layer is of beryllium oxide, and said second ceramic layer is of aluminum oxide.

14. A high power module containing a plurality of high power insulated gate switching transistors in heat conductive subassemblies that include a durable topside chip connection having a coefficient of thermal expansion close to that of said transistor chip, said module comprising:

a housing having a thermally conductive support plate of a material having a thermal expansion coefficient close to a given thermal expansion coefficient;

a plurality of similar semiconductor switching transistor substrate subassemblies supported on said support plate in similar low thermal resistance relationship with said support plate;

each of said semiconductor switching transistor substrate subassemblies including a ceramic wafer having opposed major faces that each are of an area less than will accommodate two high power switching transistor chips, said wafer faces being substantially completely metallized and spaced by unmetallized edges of said wafer, and forming a composite material having a composite thermal expansion coefficient close to said given thermal expansion coefficient;

each ceramic wafer having a single high power switching transistor chip thermally and electrically conductively bonded to one metallized wafer face, and a first metal tab extending from said one metallized wafer face, which tab is in low electrical resistance communication with a first active region of said switching transistor chip and which resistance is of essentially the same impedance for each subassembly, said switching transistor chip being of a semiconductor material having said given thermal expansion coefficient;

each one metallized wafer face having a first ceramic layer bonded thereto adjacent said transistor chip, said first ceramic layer having a metallized upper surface and a second metal tab extending therefrom;

each said subassembly further including a metal foil conductively bonded to electrodes on an upper surface of its respective switching transistor chip and also to said metallized upper surface of its respective first ceramic layer, whereby a low resistance connection of substantially the same impedance is provided in each subassembly between a second region of its respective transistor chip and its respective second metal tab;

each said metal foil having a second ceramic layer on its upper surface over the transistor chip to which is bonded, said second ceramic layer having a coefficient of thermal expansion close to that of said transistor chip, said second ceramic layer and said foil having a composite thermal expansion coefficient over said chip that is close to said given thermal expansion coefficient;

a first module terminal member having at least a portion disposed in said housing, in substantially equal close proximity to each first metal tab on each substrate subassembly;

an electrically conductive bond directly between each first metal tab and said first terminal member, whereby said first terminal member has a low resistance electrical connection of essentially the same impedance with said first region of each transistor chip of each substrate subassembly;

a second module terminal member having at least a portion disposed in said housing, in substantially equal close proximity to each second metal tab on each substrate subassembly; and an electrically conductive bond directly between said second metal tab and said second terminal member, whereby said second terminal member has a low resistance electrical connection of essentially the same impedance with said second region of each transistor chip of each substrate subassembly.

15. The high power module of claim 14 in which:

the transistor chip is a silicon insulated gate bipolar transistor chip; and the module further includes a gate bus conductor in series connection with a third region of each transistor of each subassembly and a trimmable resistance between said bus conductor and each said third region.

16. A composite conductor for use as soldered connector to a semiconductor device of a semiconductor material having a given thermal expansion coefficient, said conductor comprising:

a metal foil having a given major surface portion for soldering to one or more contact areas of a semiconductor device made of a semiconductor material having a given thermal expansion coefficient;

a layer of ceramic on a corresponding portion of an opposite major surface of said foil; and said ceramic and said foil having a composite thermal expansion coefficient in said portion close to said given thermal expansion coefficient.

17. A semiconductor device assembly having an improved electrical connection thereto, said assembly comprising:

a semiconductor device chip of a semiconductor material having a given thermal expansion coefficient, said chip having a contact face;

at least one area of contact on said face for a given region of said device, said area occupying a major portion of said contact face;

a metal foil having opposed major surfaces and a portion of one major surface soldered to said at least one area;

a layer of ceramic on a corresponding portion of the opposite major surface of said foil; and said ceramic and said foil having a composite thermal expansion coefficient in said portion close to said given thermal expansion coefficient.

18. The semiconductor device assembly of claim 17 in which the semiconductor material is silicon, the metal foil is copper, and said ceramic layer is alumina.

* * * * *